(12) United States Patent
Kobayashi et al.

(10) Patent No.: US 8,398,813 B2
(45) Date of Patent: Mar. 19, 2013

(54) PROCESSING APPARATUS AND PROCESSING METHOD

(75) Inventors: Yasuo Kobayashi, Nirasaki (JP); Masao Yoshioka, Nirasaki (JP)

(73) Assignee: Tokyo Electron Limited, Minato-Ku, Tokyo-To (JP)

( * ) Notice: Subject to any disclaimer, the term of this patent is extended or adjusted under 35 U.S.C. 154(b) by 812 days.

(21) Appl. No.: 11/980,613

(22) Filed: Oct. 31, 2007

(65) Prior Publication Data

US 2008/0067147 A1 Mar. 20, 2008

Related U.S. Application Data

(63) Continuation of application No. 11/002,788, filed on Dec. 3, 2004, which is a continuation of application No. 09/667,768, filed on Sep. 22, 2000, now abandoned, which is a continuation of application No. PCT/JP00/05410, filed on Aug. 11, 2000.

(30) Foreign Application Priority Data

Aug. 13, 1999 (JP) .................................. 1999-229338

(51) Int. Cl.
  *C23F 1/00* (2006.01)
(52) U.S. Cl. ..................................... 156/345.31; 216/67
(58) Field of Classification Search .................. 118/719, 118/724, 725; 156/345.31, 345.37; 216/67
See application file for complete search history.

(56) References Cited

U.S. PATENT DOCUMENTS

| | | | |
|---|---|---|---|
| 3,716,424 A | 2/1973 | Schoolar |
| 4,123,663 A | 10/1978 | Horiike |
| 4,192,706 A | 3/1980 | Horiike |
| 4,391,617 A | 7/1983 | Way |
| 4,572,956 A | 2/1986 | Tojo et al. |
| 4,599,869 A | 7/1986 | Ozin et al. |
| 4,615,756 A | 10/1986 | Tsujii et al. |
| 4,687,544 A | 8/1987 | Bersin |

(Continued)

FOREIGN PATENT DOCUMENTS

| | | |
|---|---|---|
| EP | 0 887 845 A2 | 12/1998 |
| EP | 1 001 454 A2 | 5/2000 |

(Continued)

OTHER PUBLICATIONS

U.S. Appl. No. 09/655,787. Kobayashi, Dec. 6, 2000, abandoned.

(Continued)

*Primary Examiner* — Karla Moore
(74) *Attorney, Agent, or Firm* — Finnegan, Henderson, Farabow, Garrett & Dunner, L.L.P.

(57) ABSTRACT

The present invention provides a processing apparatus and a processing method, both of which can carry out a low-temperature process to allow active gas species to react with an oxide film on an object to be processed to form a product film and a heating process to heat the object to a predetermined temperature to evaporate the product film, in succession. This processing apparatus 12 is provided with a shielding plate 103 capable of entering a gap between the object W and a transparent window 28 and also withdrawing from the gap. On condition that the shielding plate 103 is closed to cut off irradiation heat from the transparent window 28, the product film is formed by allowing the active gas species of $NF_3$ gas to react with a native oxide film on the object under the low-temperature condition. After that, upon closing the shielding plate 103, the native oxide film is removed by applying heat irradiated from a heating lamp 36 to the product film through the transparent window 28. Additionally, the apparatus includes a low-temperature processing chamber 207 allowing $NF_3$ gas to react with the native oxide film at a low temperature and a heating chamber 209 for heating the product film, independently.

6 Claims, 4 Drawing Sheets

U.S. PATENT DOCUMENTS

| | | |
|---|---|---|
| 4,689,112 A | 8/1987 | Bersin |
| 4,699,689 A | 10/1987 | Bersin |
| 4,806,321 A | 2/1989 | Nishizawa et al. |
| 4,863,561 A | 9/1989 | Freeman et al. |
| 4,913,929 A | 4/1990 | Moslehi et al. |
| 4,952,273 A | 8/1990 | Popov |
| 4,952,299 A | 8/1990 | Chrisos et al. |
| 4,988,644 A | 1/1991 | Jucha et al. |
| 5,028,724 A | 7/1991 | Ivankovits et al. |
| 5,030,319 A | 7/1991 | Nishino et al. |
| 5,041,719 A | 8/1991 | Harris et al. |
| 5,076,205 A | 12/1991 | Vowles et al. |
| 5,282,925 A | 2/1994 | Jeng et al. |
| 5,328,558 A | 7/1994 | Kawamura |
| 5,350,480 A | 9/1994 | Gray |
| 5,501,740 A | 3/1996 | Besen et al. |
| 5,512,320 A | 4/1996 | Turner et al. |
| 5,527,417 A | 6/1996 | Iida et al. |
| 5,616,208 A | 4/1997 | Lee |
| 5,624,499 A | 4/1997 | Mizuno et al. |
| 5,759,268 A | 6/1998 | Begin et al. |
| 5,785,796 A | 7/1998 | Lee |
| 5,789,322 A | 8/1998 | Brown et al. |
| 5,802,439 A | 9/1998 | Bennett et al. |
| 5,830,310 A | 11/1998 | Doi |
| 5,884,009 A | 3/1999 | Okase |
| 5,919,336 A | 7/1999 | Kikuchi et al. |
| 5,968,279 A * | 10/1999 | MacLeish et al. ............ 134/1.2 |
| 6,006,694 A | 12/1999 | DeOrnellas et al. |
| 6,024,045 A | 2/2000 | Kikuchi et al. |
| 6,300,600 B1 | 10/2001 | Ratliff et al. |
| 6,301,434 B1 | 10/2001 | McDiarmid et al. |
| 6,305,186 B1 | 10/2001 | Py et al. |
| 6,352,593 B1 | 3/2002 | Brors et al. |
| 6,403,925 B1 | 6/2002 | Johnsgard et al. |
| 6,488,769 B1 | 12/2002 | Oba |
| 6,497,767 B1 | 12/2002 | Okase et al. |
| 6,706,334 B1 | 3/2004 | Kobayashi et al. |
| 6,849,328 B1 | 2/2005 | Medwick et al. |
| 2001/0015261 A1 | 8/2001 | Kobayashi et al. |
| 2003/0049372 A1 | 3/2003 | Cook et al. |

FOREIGN PATENT DOCUMENTS

| | | |
|---|---|---|
| EP | 1 139 398 A1 | 10/2001 |
| GB | 2 276 764 A | 10/1994 |
| JP | 64-74717 | 3/1989 |
| JP | 1-138713 A | 5/1989 |
| JP | 02-256235 | 10/1990 |
| JP | 3-155621 A | 7/1991 |
| JP | 4-32230 | 2/1992 |
| JP | 4-32230 A | 2/1992 |
| JP | 6-349791 | 12/1994 |
| JP | 6-349791 A | 12/1994 |
| JP | 07029912 A | 1/1995 |
| JP | 08-186081 | 7/1996 |
| JP | 10-335316 A | 12/1998 |
| JP | 11-54496 | 2/1999 |
| JP | 11-54496 A | 2/1999 |
| JP | 20-00208498 | 7/2000 |
| JP | 2000-208498 A | 7/2000 |
| TW | 277007 | 1/1996 |
| TW | 357424 | 5/1999 |
| WO | WO 00/22660 | 4/2000 |
| WO | WO 01/27988 A1 | 4/2001 |
| WO | 2005/0150455 | 7/2005 |

OTHER PUBLICATIONS

U.S. Appl. No. 10/110,324, Kobayashi et al., international filed Oct. 12, 2000.

U.S. Appl. No. 09/086,574, Kobayashi, May 29, 1998, abandoned.

English translation, dated Feb. 15, 2002, of PCT International Preliminary Examination Report for PCT/JP00/05410, dated Jul. 5, 2001.

* cited by examiner

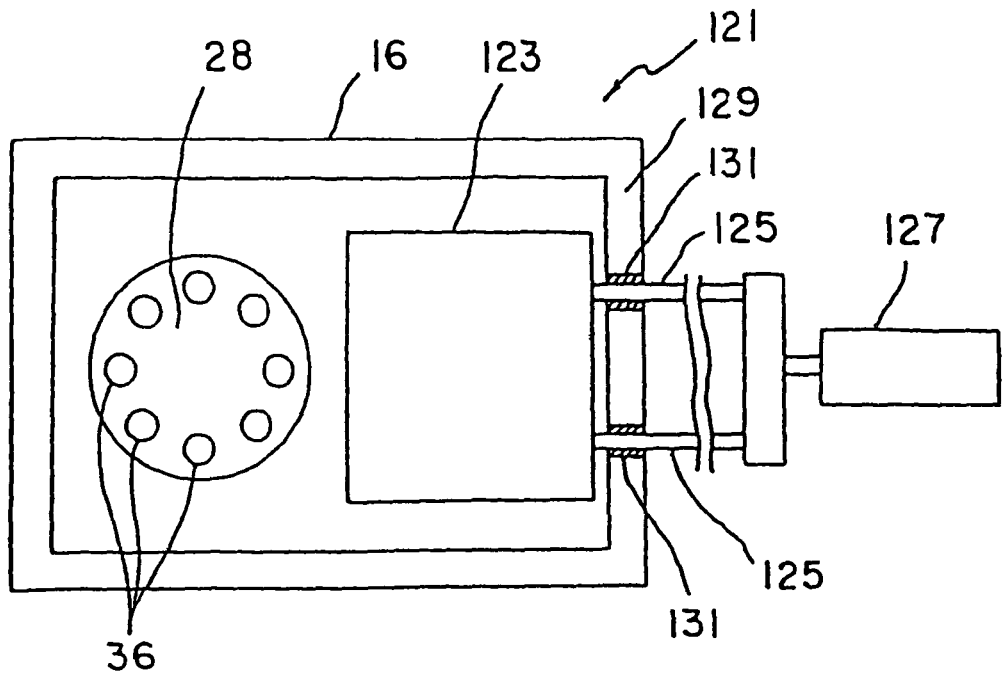
F I G. 4
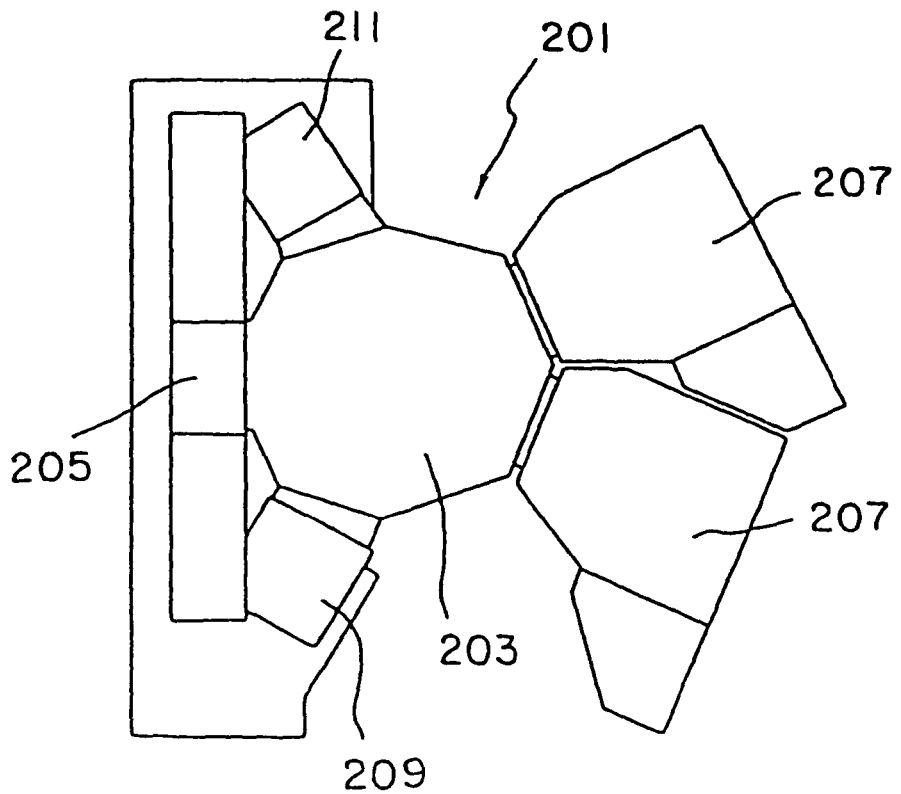
F I G. 5

PROCESSING APPARATUS AND PROCESSING METHOD

This is a continuation of application Ser. No. 11/002,788, Dec. 3, 2004, which is a continuation of application Ser. No. 09/667,768 filed Sept. 22, 2000 (now abandoned), which is a continuation of International Application No. PCT/JP00/05410, filed Aug. 11, 2000. Both Application No. 09/667,768 and International Application No. PCT/JP00/05410 claimed priority from Japanese Patent Application No. 11-229338, filed Aug. 13, 1999. All of these Applications are incorporate herein by reference.

BACKGROUND OF THE INVENTION

1. Field of the Invention

The present invention relates to a processing apparatus for removing an oxide film from a surface of an object to be processed and also relates to a processing method of removing the oxide film from the surface.

2. Description of the Related Art

Hitherto, as the method of removing native oxide films in fine holes formed in a wafer effectively, there is a surface treatment method as follows.

At first, by using of plasma technique, a mixture of $N_2$ gas and $H_2$ gas is activated to produce active gas species. Second, $NF_3$ gas is added to the down flow of the active gas species in order to activate $NF_3$ gas. Next, it is executed to allow the active gas species of $NF_3$ gas to react with a native oxide film on the surface of the wafer thereby producing a product film. By heating the wafer to a designated temperature subsequently, the product film is sublimated for its removal.

As the apparatus used in such a method, there is known a processing apparatus which includes a processing container for accommodating a wafer therein, a $NF_3$ active gas species generating unit for generating the active gas species of $NF_3$ gas, heating means positioned outside the processing container in order to heat the wafer and a transparent window arranged between the heating means and the above object to allow heat energy from the heating means through. In this apparatus, it is executed to make the active gas species of $NF_3$ gas to react with the native oxide film formed on the surface of the wafer, at a low temperature, thereby forming a product film. Next, by the heating means, the product film is heated to a predetermined temperature for its sublimation, removing the native oxide film.

In the above processing apparatus, however, if the heating process of the wafer has been completed and subsequently, a new wafer is loaded into the processing container for the low-temperature treatment, then the new wafer is undesirably heated due to heat radiated from the transparent window heated in the previous heating process. Therefore, it is necessary to wait for the transparent window to be cooled to a designated temperature, thereby causing the processing efficiency to be deteriorated remarkably.

DISCLOSURE OF THE INVENTION

In order to solve the above problem, the object of the present invention is to provide a processing apparatus and a processing method, by which it is possible to prevent the temperature of the object from rising due to residual heat generated in the heating process and also remained in a transparent window, thereby accomplishing the continuous processing for the objects to be processed.

In accordance with the first feature of the invention, there is provided a processing apparatus for removing an oxide film from a surface of an object to be processed, the processing apparatus comprising: a processing container accommodating the object to be processed therein; an active gas species generating unit for producing active gas species; heater arranged outside the processing container to heat the object to be processed; a transparent window formed in the processing container between the heater and the object to be processed, the transparent window sheltering the interior of the processing container from the outside in an airtight manner and also allowing heating energy from the heater to pass through; and a shielding plate provided in such a way that the shielding plate can be inserted into or extracted from a gap between the object and the transparent window; in the processing apparatus, on condition that the shielding plate is closed to insulate irradiation heat irradiated from the transparent window, the processing apparatus allows the oxide film formed on the surface of the object to react with the active gas species, thereby forming a product film. Subsequently, the processing apparatus opens the shielding plate so as to apply the irradiation heat from the heater to the product film through the transparent window and further heats the product film to a predetermined temperature for vaporization, thereby removing the product film.

In accordance with the second feature of the invention, there is also provided a processing apparatus for removing an oxide film from a surface of an object to be processed, the processing apparatus comprising: a first processing chamber having an active gas species generating unit for producing active gas species and also allowing the oxide film formed on the surface of the object to react with the active gas species under a condition of low temperature, thereby forming a product film; a second processing chamber having heater for heating the object to be processed and allowing the heater to heat the product film formed on the surface of the object to a predetermined temperature for vaporization, thereby removing the product film; and transporter for transporting the object between the first processing chamber and the second processing chamber.

In accordance with the third feature of the invention, the active gas species are active gas species of $NF_3$ gas.

In accordance with the fourth feature of the invention, the shielding plate is provided with cooler for cooling the shielding plate itself.

In accordance with the fifth feature of the invention, the transporter is arranged in a transfer chamber connected to the first processing chamber and the second processing chamber and also filled up with a non-reactive atmosphere inside.

In accordance with the sixth feature of the invention, the active gas species generating unit includes a plasma generating tube having a plasma generating part, a plasma gas introducing part for supplying both $N_2$ gas and $H_2$ gas into the plasma generating tube and a $NF_3$ gas supplying part for adding $NF_3$ gas to the active gas species flowing down from an interior of the plasma generating tube.

In accordance with the seventh feature of the invention, the plasma generating part comprises a microwave generating source for generating microwaves and a waveguide for introducing the so-generated microwaves into the plasma generating tube.

In accordance with the eighth feature of the invention, there is also provided a processing method of removing an oxide film from a surface of an object to be processed while using a processing apparatus which includes a processing container accommodating the object to be processed therein, heater arranged outside the processing container to heat the object to be processed, a transparent window formed in the processing container between the heater and the object to be processed, and a shielding plate provided in such a way that the shielding plate can be inserted into or extracted from a gap between the object and the transparent window, the processing method comprising the steps of: allowing the oxide film formed on the surface of the object to react with active gas species under a condition of low temperature on condition that the shielding plate is closed to insulate irradiation heat irradiated from the transparent window, thereby forming a product film; and subsequently, opening the shielding plate and applying the irradiation heat from the heating means to the product film through the transparent window to heat the product film to a predetermined temperature for vaporization, thereby removing the product film.

In accordance with the ninth feature of the invention, there is also provided a processing method of removing an oxide film from a surface of an object to be processed, the processing apparatus comprising: allowing the oxide film formed on the surface of the object to react with active gas species under a condition of low temperature in a first processing chamber, thereby forming a product film; transporting the object having the product film formed thereon from the first processing chamber to a second processing chamber; and heating the product film formed on the surface of the object in the second processing chamber, to a predetermined temperature for vaporization, thereby removing the product film.

BRIEF DESCRIPTION OF THE DRAWINGS

FIG. 4 is a schematic plan view showing another movable shutter; and

FIG. 5 is a structural view showing the processing apparatus in accordance with the second embodiment of the present invention.

BEST MODE OF EMBODIMENTS OF THE INVENTION

Preferred embodiments for embodying the processing apparatus of the present invention will be described with reference to figures, below.

Figure 1:
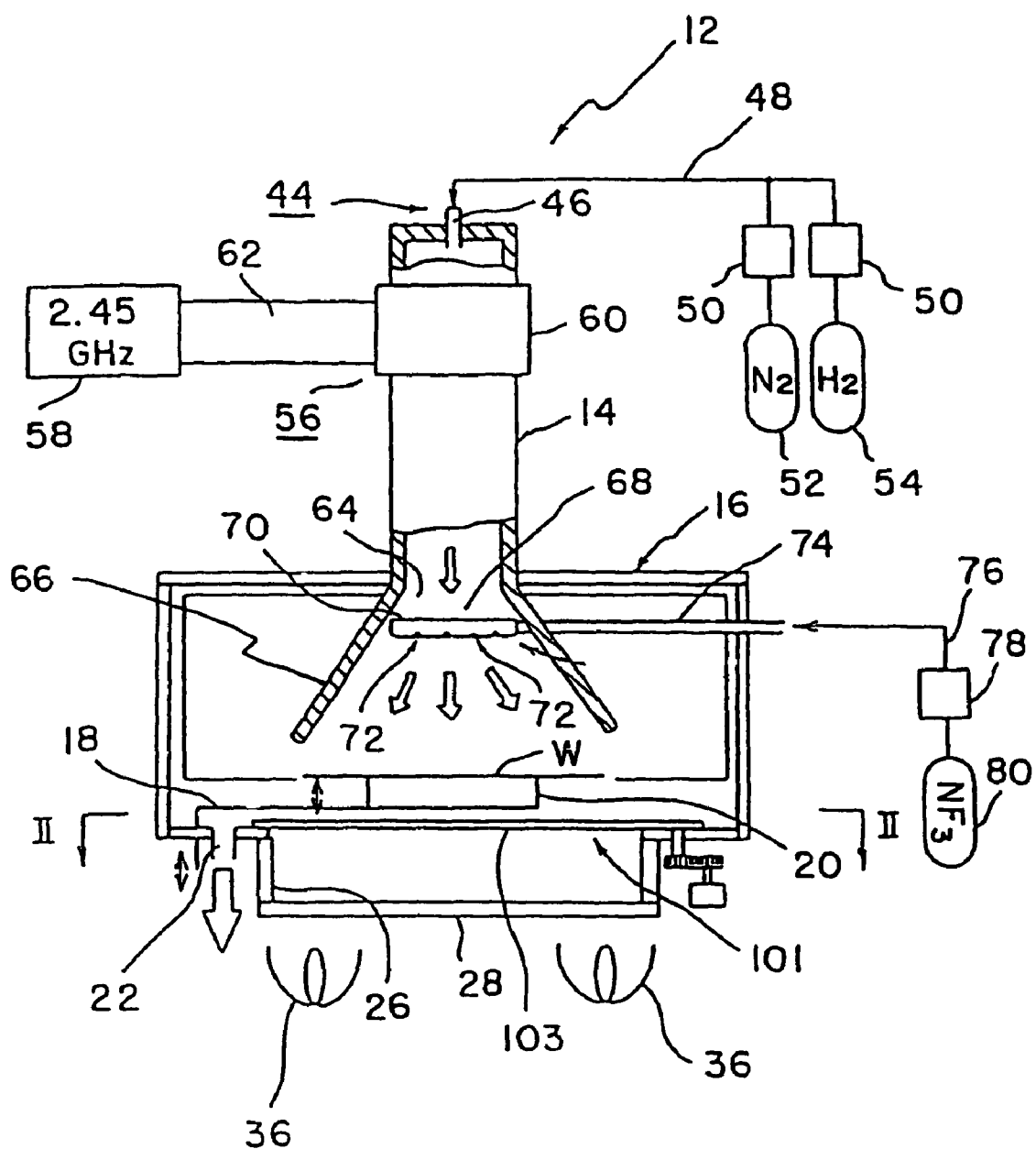
FIG. 1 is a structural view showing a processing apparatus in accordance with the first embodiment of the present invention.
Figure 2:
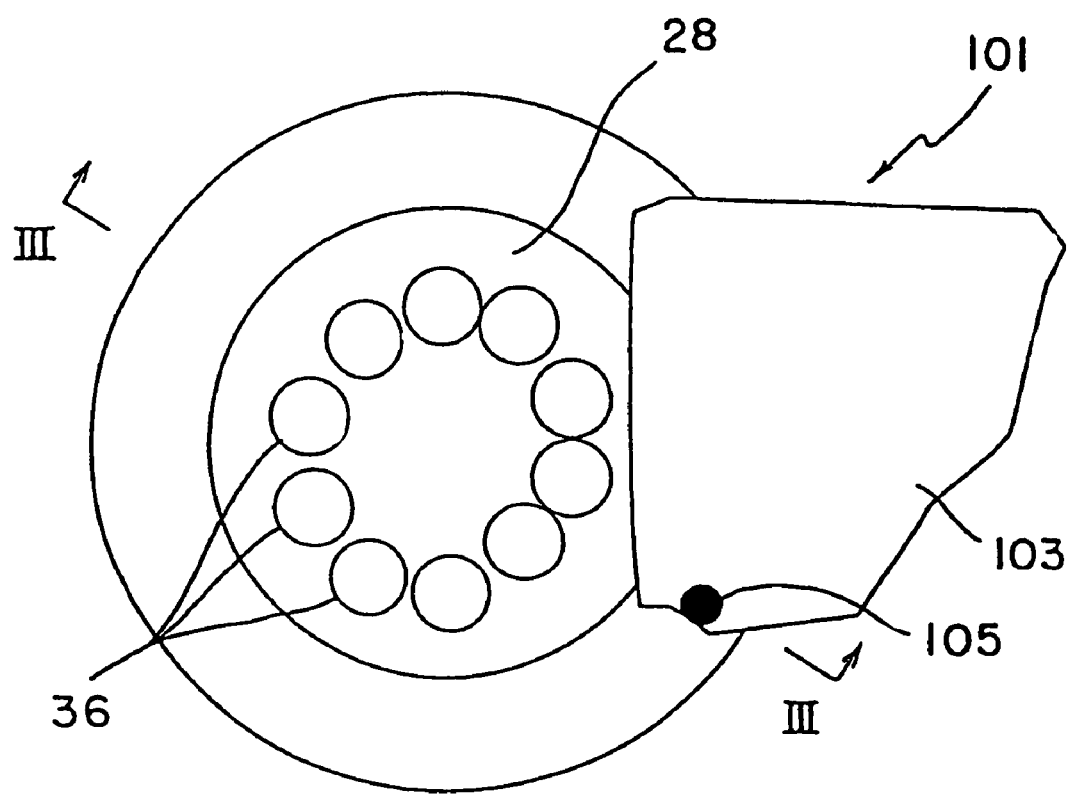
FIG. 2 is a schematic plan view taken along a line II-II of FIG. 1, showing a movable shutter of the processing apparatus of FIG. 1.
Figure 3:
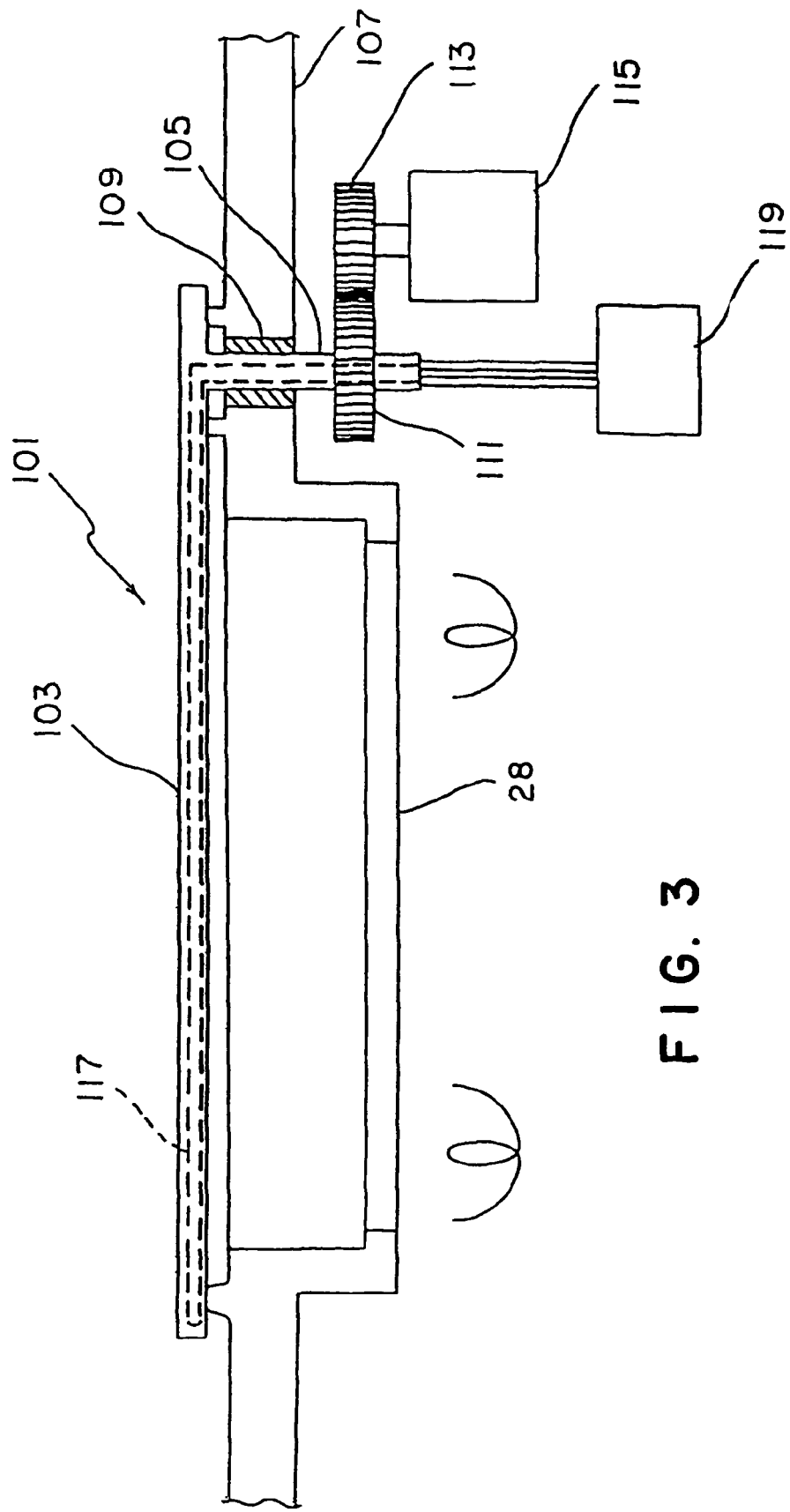
FIG. 3 is a schematic sectional view taken along a line III-III of FIG. 2.

FIGS. 1 to 3 are structural views showing the processing apparatus in accordance with the first embodiment of the invention. In FIG. 1, the processing apparatus 12 includes a plasma generating tube 14 for activating a mixture gas of $N_2$ gas and $H_2$ gas by plasma, and a processing container 16 for carrying out a designated surface treatment for removing an oxide film particularly, a native oxide film (i.e. oxide film unintentionally produced by the contact with oxygen in the air, cleaning liquid, etc.) from a semiconductor wafer W as the object to be processed.

The processing container 16 is in the form of a cylinder made of aluminum. In the processing container 16, there is a quartz mount 20 carried by a support member 18 which is movable up and down. The processing container 16 is provided, on the margin of a bottom thereof, with an exhaust port 22 allowing the interior of the container 16 to be evacuated. Below the mount 20, an irradiation port 26 is formed on the bottom part of the processing container 16 and a quartz transparent window 28 is fitted to the irradiation port 26 in an airtight manner. Below the transparent window 28, a number of heating lamps 36, such as halogen lamps, are arranged to heat the mount 20 from the underside, so that heating light emitted from the healing lamps 36 permeates through the transparent window 28 and enters into the back face of the wafer W.

On the other hand, the plasma generating tube 14 in the form of a tube made of e.g. quartz is fitted to the processing container 16 in an airtight manner. Further, the plasma generating tube 14 is arranged so as to stand on the container 16 while opening into the ceiling part of the container 16. The plasma generating tube 14 is provided, at a top end thereof, with a plasma-gas ejecting part 44 for introducing a plasma gas consisting of $N_2$ gas and $H_2$ gas into the tube. The plasma-gas ejecting part 44 is equipped with an ejection nozzle 46 inserted into the inside of the plasma generating tube 14 and connected to a gas passage 48. While, through respective flow control units 50 like mater controllers, the gas passage 48 is connected to a $N_2$ gas source 52 for storing $N_2$ gas and a $H_2$ gas source 54 for storing $H_2$ gas, respectively.

A plasma generating part 56 is arranged just below the ejection nozzle 46. The plasma generating part 56 comprises a microwave generating source 58 generating a microwave of 2.45 GHz and a microwave supplier 60, such as an Ebenson-type waveguide, arranged in the plasma generating tube 14, so that the microwave generated in the microwave generating source 58 is supplied into the microwave supplier 60 through a rectangular waveguide 62. Then, the so-supplied microwave allows plasma to be produced in the plasma generating tube 14 and therefore, the mixture of $H_2$ gas and $N_2$ gas is activated to form a down flowing of the mixture.

At an outlet 64 identical to the lowermost end of the plasma generating tube 14, there is communicably provided a quartz cover member 66 diverging downward in the form of an umbrella, which covers the upward of the mount 20 thereby to drop a gas on the wafer W effectively. Just below the outlet 64, a $NF_3$ gas supplier 68 is arranged to supply $NF_3$ gas to the wafer. The $NF_3$ gas supplier 68 has an annular shower head 70 made of quartz and provided with numerous gas orifices 72. The shower head 70 is connected to a $NF_3$ gas source 80 storing $NF_3$ gas, through a communication tube 74, a gas passage 76 and a flow controller 78.

In the structure mentioned above, a movable shutter 101 is disposed between the mount 20 and the transparent window 28. The movable shutter 101 has a shielding plate 103 rotatably arranged so as to cover the transparent window 28, as shown in FIGS. 2 and 3. The shielding plate 103 is provided with a rotating shaft 105 to penetrate an outer wall 107 of the processing container 16 in order to rotate the plate 103. Between the rotating shaft 105 and the outer wall 107, a magnetic fluid seal 109 is arranged to hold the rotating shaft 105 tightly but rotatably to the outer wall 107. The rotating shaft 105 is equipped with a shaft gear 111 meshing with a motor gear 113 of a drive motor 115.

With the operation of the drive motor 115, it allows the shielding plate 103 to rotate through the shaft gear 111 and the motor gear 113, so that the plate 103 can occupy its opening position of FIG. 2 and the closing position of FIG. 3.

A coolant passage 117 is formed inside the shielding plate 103 and also the rotating shaft 105. Extending from the lower end of the rotating shaft 105 to the exterior of the processing container 16, the coolant passage 117 is connected to a coolant circulating means 119 arranged outside the processing container 16. When the coolant circulating means 119 supplies the coolant passage 117 with a coolant, such as water, the shielding plate 103 can be cooled down. With the arrangement mentioned above, it is possible to prevent the temperature of the shielding plate 103 from being elevated by radiant heat irradiated from the transparent window 28. Accordingly, the radiant heat from the shielding plate 103 can be prevented from reaching the wafer W thereby to avoid rising the temperature of the wafer W.

Meanwhile, FIG. 4 is a view of an example of another movable shutter 121. The movable shutter 121 includes a shielding plate 123 for covering the transparent window 28. Connected with he shielding plate 123 are two drive shafts 125, 125 which has their other ends connected to a piston rod of a hydraulic cylinder 127. Further, in the processing container 16 where the drive shafts 125, 125 penetrate an outer wall 129, respective magnetic fluid seals 131 are arranged between the drive shafts 125, 125 and the outer wall 129, allowing the shafts 125, 125 to move in relation to the outer wall 129 while maintaining respective gaps between the shafts 125, 125 and the outer wall 129 in airtight manner. In this way, the operation of the hydraulic cylinder 127 allows the shielding plate 123 to occupy its opening position and the closing position.

Also in this case, similarly to the case of FIG. 3, the shielding plate 123 and the drive shafts 125 may be provided, inside thereof, with coolant passages while their ends outside the processing container 16 are connected with a coolant circulating means arranged outside the processing container 16 to allow the shielding plate 123 to be cooled. With this structure, it is possible to restrain the temperature of the wafer W from be elevated by the radiant heat from the shielding plate 123.

Next, we explain a removing method of the native oxide film, which is performed by the apparatus constructed above. First, load the semiconductor wafer W as an object to be processed into the processing container 16 via a not-shown gate valve and put the wafer W on the mount 20. In this wafer W, there exist contact holes etc. formed in e.g. the preceding stage, while the native oxide film is generated on each bottom of the contact holes.

After loading the wafer W in the processing container 16, close up the chamber 16 tightly and subsequently evacuate it. Then, introduce $N_2$ gas and $H_2$ gas, which have been fed from the $N_2$ gas source 52 and the $H_2$ gas source 54 respectively, into the plasma generating tube 14 through the plasma-gas ejecting part 44, at predetermined flow rates. Simultaneously, generate the microwave of 2.45 GHz by the microwave generating source 58 of the plasma generating part 56 and introduce the microwave into the plasma generating tube 14 via the microwave supplier 60. Consequently, by the microwave, both $N_2$ gas and $H_2$ gas are activated and changed into plasmatic gases to form active gas species. These active gas species form their down flow by the evacuation in the processing container 16 and fall in the plasma generating tube 14 toward the outlet 64.

On the other hand, $NF_3$ gas supplied from the $NF_3$ gas source 80 is added to the down flowing active gas species of the mixture gas composed of $N_2$ gas and $H_2$ gas, through the annular shower head 70. As a result, the so-added $NF_3$ gas is also activated by the down flowing active gas species. In this way, $NF_3$ gas is activated to react with the native oxide film on the surface of the wafer W in combination with the above-mentioned down flowing active gas species, thereby producing a product film having elements Si, N, H, F mixed therein.

Since this processing is accelerated at low temperature, the wafer W does not have to be heated during the processing and the product film is produced at room temperature.

Hereat, during the processing, the movable shutter 101 is under the closed condition. The reason why the shutter closes is to prevent the temperature of the wafer from being elevated since the radiant heat from the transparent window 28 heated in the previous heating process reached the wafer W.

As to the processing conditions, the respective flow rates of $H_2$ gas, $NF_3$ gas and $N_2$ gas are equal to 10 sccm, 150 sccm, 1400 sccm, respectively. The other conditions are respectively 4 Torr in processing pressure, 400 W in plasma voltage, and 1 minute in processing time. In this way, it is carried out to form the product film reacting with the native oxide film on the wafer surface. In this case, since the upside of the mount 20 is covered with the cover member 66 in the form of an umbrella, the down flowing active gas species flow down on the wafer surface effectively without dispersing to the circumference, so that the product film can be completed effectively.

When the formation of the product film is completed in this way, stop respective supplies of $H_2$ gas, $NF_3$ gas and $N_2$ gas and likewise the driving of the microwave generating source 58 and thereupon, the processing container 16 is evacuated to discharge residual gas. Subsequently, bring the movable shutter 101 to the opening position and light the heating lamp 36 to heat the wafer W into a predetermined temperature, for example, more than 100° C. Owing to this heating, the above product film is sublimated for its vaporization. Thus, the native oxide film on the wafer W is eliminated, so that a Si-surface appears on the wafer surface. Then, the processing conditions are 1 mTorr in processing pressure and the order of 2 minutes in processing time.

As mentioned above, the processing apparatus is provided, between the wafer W and the transparent window 28, with the movable shutter 101 capable of entering and withdrawing. Therefore, when the active $NF_3$ gas reacts with the native oxide film on the wafer surface to produce the product film having elements Si, N, H, F mixed therein, namely, at the processing at low temperature, it is possible to prevent the wafer W from being heated by the radiant heat emitted from the transparent window 28 heated in the previous heating process. Accordingly, in case of repeating the above "low temperature" treatment and the heating treatment against a plurality of wafers by turns, it is possible to prevent the wafer during the low temperature treatment from being heated by the radiant heat due to the previous heating treatment. Therefore, the low temperature treatment and the heating treatment can be successively carried out with no interval, accomplishing the removal operation of the oxide film effectively.

In the movable shutter of the processing apparatus, since the motor 115 outside the processing container and the shielding plate 103 inside the container are connected with each other by the rotating shaft 105 sealed by the magnetic fluid seal 109, there is no need to provide any driving means in the processing container, whereby it can be small-sized with the prevention of contamination.

Such operation and effect are similar to the reciprocating movable shutter 121 of FIG. 4.

FIG. 5 shows the second embodiment of the present invention. A processing apparatus 201 is characterized to have a low-temperature processing chamber and a heating chamber independently. The processing apparatus 201 is provided, at a center thereof, with a transfer chamber 203. In the transfer chamber 203, there is a transfer device for transporting the wafer. At the interior of the transfer chamber 203, there is established a non-reactive atmosphere, for example, vacuum which can prevent the occurrence of native oxide film on the wafer W during the transportation of wafer W. In the transfer chamber 203, a load locking chamber 205 is provided in order to load the wafer to be processed into the transfer chamber 203.

While, on the opposite side of the transfer chamber 203 to the load locking chamber 205, there are provided two low-temperature processing chambers 207, 207. Each low-temperature processing chamber 207 substantially corresponds to the processing apparatus 12 of FIG. 1 while removing the movable shutter 101 and the heating lamp 36. Then, although it is necessary that the processing container 16 has its bottom closed tightly, a member for closing the bottom of the container 16 doesn't have to be provided with such light-permeability as the transparent window 18 of FIG. 1. Thus, for example, an aluminum plate in place of the transparent window 28 of FIG. 1 may close the bottom of the processing container 16. In this low-temperature processing chamber 207, the active $NF_3$ gas reacts with the native oxide film on the wafer surface to produce the product film having elements Si, N, H, F mixed therein.

Again, the transfer chamber 203 is provided with a heating chamber 209. In the heating chamber 209, there is provided heating means, for example, a well-known stage heater of resistance heating type, which allows the wafer W to be heated. In the heating chamber 209, the wafer W after the low-temperature treatment is heated to a predetermined temperature, for example, more than 100° C. Owing to this heating, the above product film is sublimated for its vaporization. Thus, the native oxide film on the wafer W is eliminated.

The transfer chamber 203 further includes a cooling chamber 211. This cooling chamber 211 serves to cool the wafer after the heating treatment. Despite that the processed wafer is unloaded while being accommodated in a resinous cassette, there is the possibility of the resin cassette being damaged by the wafer of high temperature. Therefore, the apparatus is constructed so as to cool the wafer before it is accommodated in the cassette.

In the so-constructed processing apparatus 201, the wafer having the native oxide film formed thereon is transported from the load locking chamber 205 into the transfer chamber 203. Next, the wafer is transported to the low-temperature processing chamber 207 where the so-called low-temperature treatment is carried out. Since the processing apparatus 201 has the heating chamber 209 arranged independently of the low-temperature processing chamber 207, it is possible to prevent the residual heat in the previous heating process from exerting a bad influence on the low-temperature treatment. After that, the wafer to be processed is fed to the heating chamber 209. In the heating chamber 209, the wafer W after the low-temperature treatment is heated to a designated temperature, for example, more than 100° C. to sublimate (evaporate) the above product film. Consequently, the native oxide film on the wafer W is removed. Thereafter, the so-heated wafer is fed to the cooling chamber 211. After being cooled, the wafer is accommodated in the cassette and discharged from the chamber 211. Accordingly, it is possible to prevent the wafer of high temperature from damaging the resinous cassette.

As mentioned above, since the processing apparatus 201 has the low-temperature chamber 207 and the heating chamber 209 arranged independently of each other, it is possible to prevent the wafer from being heated due to the influence of heating process when the active $NF_3$ gas reacts with the native oxide film on the wafer to produce the product film having Si, N, H, F mixed therein, in other words, at the low-temperature treatment. Thus, the low-temperature treatment and the heating process can be continuously performed with no interval, so that it is possible to accomplish the oxide film removing operation effectively.

According to the invention, there is provided the shielding plate which is adapted so as to enter the gap between the object and the transparent window and also withdraw from the gap. Therefore, the closing of the shielding plate makes it possible to insulate the heat irradiated from the transparent window and also allows the active gas species to react with the oxide film under the low-temperature condition. Further in the present invention, the low-temperature treatment allowing the active gas species to react with the oxide film is carried out in a different chamber from that of the subsequent heating process. Accordingly, the low-temperature treatment and the heating process can be continuously performed with no interval, so that it is possible to accomplish the oxide film removing operation effectively.

What is claimed is:

1. A processing apparatus for removing an oxide film from a surface of an object to be processed, the processing apparatus comprising:

a low-temperature processing container for accommodating the object to be processed therein;

a plasma-generating gas source for feeding a plasma-generating gas;

a plasma-generating unit for changing the plasma-generating gas into plasmatic gas;

an additive gas feeding unit arranged in the low-temperature processing container for feeding an additive gas having element F into the plasmatic gas that has been fed to a position of the low-temperature processing container; and a heating processing container for heating the object to be processed;

wherein the plasmatic gas that has been fed into the low-temperature processing container and the additive gas having element F that has been activated by being fed into the plasmatic gas are adapted to be supplied onto the oxide film on the surface of the object that has been accommodated in the low-temperature processing container, and to react with the oxide film under an unheated condition in order to form a reaction-product film having elements Si, N, H, F, and O mixed therein, and wherein the heating processing container is adapted to heat the object on which the reaction-product film has been formed, in order to evaporate and remove the reaction-product film.

2. A processing apparatus as claimed in claim 1, further comprising a transfer device for transferring the object to be processed between the low-temperature processing container and the heating processing container.

3. A processing apparatus as claimed in claim 1, further comprising a transfer chamber arranged between the low-temperature processing container and the heating processing container.

4. A processing apparatus as claimed in claim 3, wherein there is established a non-reactive atmosphere at the interior of the transfer chamber.

5. A processing method of removing an oxide film from a surface of an object to be processed while using a processing apparatus as claimed in claim 1, the processing method comprising the steps of:

conveying, into the low-temperature processing container, an object to be processed having a surface on which an oxide film has been formed;

feeding the plasmatic gas into the low-temperature processing container, feeding the additive gas having element F into the plasmatic gas that has been fed to a position of the low-temperature processing container, so as to activate the additive gas having element F; and allowing the plasmatic gas and the activated additive gas to react with the oxide film under an unheated condition in order to form a reaction-product film having elements Si, N, H, F, and O mixed therein;

transferring the object to be processed from the low-temperature processing container to the heating processing vessel, and heating the object to be processed that has been transferred to the heating processing container, in order to evaporate and remove the reaction-product film.

6. A processing method as claimed in claim 5, wherein the object to be processed is transferred from the low-temperature processing container to the heating processing vessel under a non-reactive atmosphere.

* * * * *